July 30, 1963 P. HOBLEY 3,099,808

CHANNEL TUNING SYSTEM FOR SIGNAL RECEIVERS IN WHICH TUNING COMPONENTS ASSIGNED TO UNSELECTED CHANNELS FORM PART OF ADJACENT CHANNEL TRAPS

Filed Jan. 24, 1961 2 Sheets-Sheet 1

INVENTOR.
PETER HOBLEY
BY Eugene M. Whitacre
ATTORNEY

July 30, 1963 P. HOBLEY 3,099,808

CHANNEL TUNING SYSTEM FOR SIGNAL RECEIVERS IN WHICH TUNING COMPONENTS ASSIGNED TO UNSELECTED CHANNELS FORM PART OF ADJACENT CHANNEL TRAPS

Filed Jan. 24, 1961 2 Sheets-Sheet 2

INVENTOR.
PETER HOBLEY
BY Eugene M. Whitacre
ATTORNEY

United States Patent Office 3,099,808

Patented July 30, 1963

3,099,808

CHANNEL TUNING SYSTEM FOR SIGNAL RECEIVERS IN WHICH TUNING COMPONENTS ASSIGNED TO UNSELECTED CHANNELS FORM PART OF ADJACENT CHANNEL TRAPS

Peter Hobley, Pointe Claire, Quebec, Canada, assignor to Radio Corporation of America, a corporation of Delaware Filed Jan. 24, 1961, Ser. No. 84,669

14 Claims. (Cl. 334—50)

The present invention relates to tuning systems for television and radio signal receivers, and the like, which employ separate tuned circuits for signal or channel selection. Such tuning systems generally provide at least one tuned circuit for each signal or channel to be received, each circuit comprising a tuning inductor element with shunt tuning capacity means therefor. These pretuned signal selecting circuits are arranged for connection individually with the signal translating channel of the receiver in predetermined sequence.

In a tuning system of this type, the signal selecting circuits are generally switched into and out of the signal translating channel by selector means embodying a selector switch or a rotary turret with switching contacts. With turret switching, the inductive tuning elements of the signal selecting circuits are generally carried by the turret and connected with contacts or contact studs which move into engagement successively with a set or group of fixed contact elements. These contact elements are connected with the receiver circuits in the signal translating channel.

Normally one set of fixed contacts are provided for the individual sequential connection of the pretuned signal selecting circuits, or circuit elements, with the signal translating channel. This leaves unused, the remainder of said signal selecting circuits. In turret tuners, for example, but one of the channel strips carrying the channel tuning inductor elements, is in use at any one time.

It is therefore an object of this invention to provide an improved channel tuning system for signal receivers, such as television and radio receivers, which makes use of adjacent channel signal selecting circuits, or circuit elements, to provide improved adjacent channel rejection with respect to the selected signal channel.

Adjacent channel interference has increasingly become more of a problem in metropolitan areas for television program reception. It is, therefore, a further object of this invention to provide simple and inexpensive circuit means for improving the adjacent channel rejection characteristic of a channel tuning system for signal receivers of the type having an individual set of tuned elements or signal selecting circuits for each signal or channel to be selected.

It is still a further object of this invention to provide a channel tuning system for signal receivers, of the type having separate tuned circuits for signal or channel selection, which operates to convert adjacent-channel tuned circuits into adjacent-channel trap circuits successively and automatically in response to adjustment of the system for each selected signal or channel.

In accordance with the invention, elimination or substantial reduction of adjacent-channel interference, in a channel tuning system for signal receivers, may be achieved by the addition of a few minor components and substantially minor circuit changes which enable existing signal selecting circuits, tuned to adjacent channels with respect to the selected channel, to be used effectively as trap circuits. To provide adjacent channel selectivity in a turret type tuner, for example, inductive tuning elements for the adjacent channels are converted into trap circuits by added tuning capacitor means connected therewith when in the adjacent-channel positions. These connections are provided by an added set or group of fixed contact elements located in each of these positions for engaging the respective turret contacts or contact elements. In the case of turret tuners with channel strips, adjacent-channel inductance elements in the turret strips or on either side of the selected channel are thus connected to external tuning capacitors so that adjacent channel traps are obtained.

Coupling between the formed trap circuits and the signal translating channel, which includes the selected channel tuning circuits and elements, may be provided (1) conductively, as with a series circuit connection, (2) by controlled mutual inductive coupling, or (3) controlled capacitive coupling, for the proper operation of the trap circuits to absorb energy at the adjacent channel frequencies or bands of frequencies.

The channel tuning system of the present invention is adapted for use with the signal selecting and translating portion of a receiver or receiving system generally involving the RF amplifier and mixer stages, although not limited thereto.

The tuning system of the present invention is particularly adapted for use with television receivers, in VHF tuner assemblies of the turret-tuner type for example, which provide selected-circuit tuning for each of the twelve channels. These circuits are pretuned for the respective channels, and selection is made for the desired channel by means of the turret element which may be rotated to bring the proper circuit elements into use in the main signal-translating channel of the receiver. There thus exist circuits or circuit elements already tuned or tunable to the frequencies of the channels adjacent to and on either side of the wanted or selected channels, and by a simple contact and circuit arrangement these may be utilized to effect attenuation of signals in the adjacent channels. In any case, such attenuation has the advantage of reducing interference in the selected channel and allowing a wider band width to be utilized. A further feature is that no additional tuned circuits are required for the construction of wave traps and filters.

The invention will however be further understood from the following description when considered in connection with the accompanying drawings, and its scope is pointed out in the appended claims.

Figure 1:
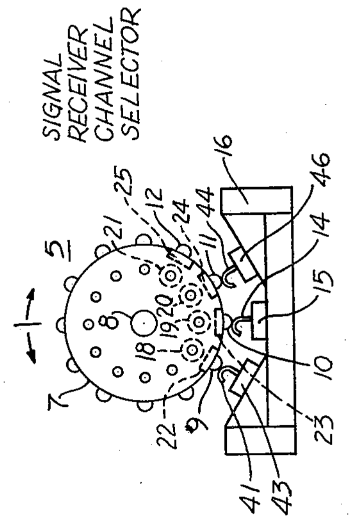
FIGURE 1 is an end view, in elevation, of a rotary turret-type tuner, representative of signal-receiver channel-selector and contact-switching means therefor arranged in accordance with the invention.
Figure 2:
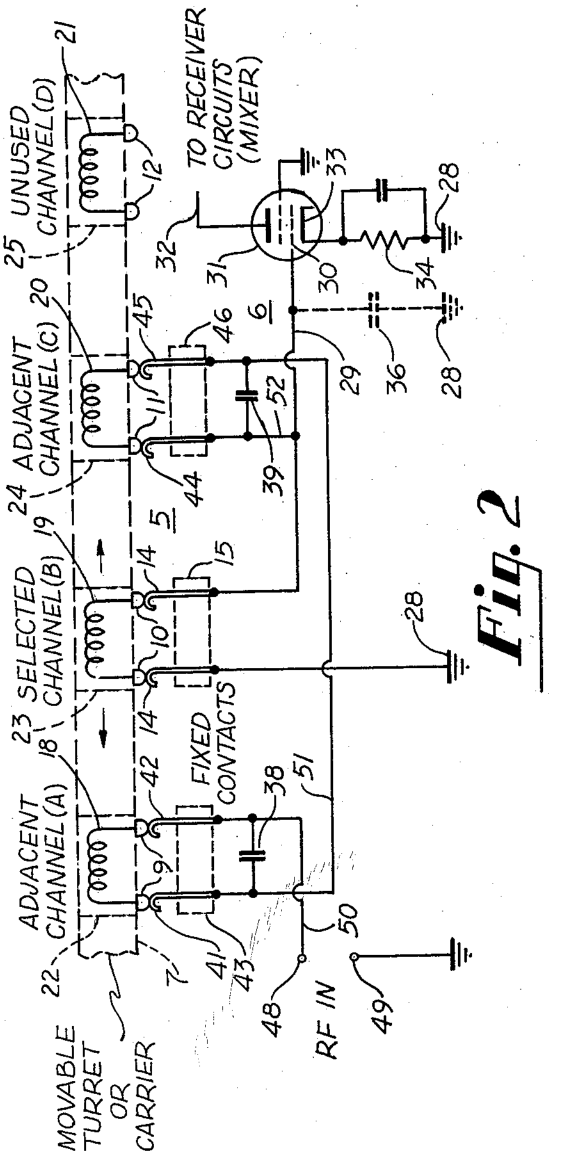
FIGURE 2 is a schematic circuit diagram of the signal selecting and translating circuits of a receiver provided with switching and channel-selector means of the type shown in FIGURE 1, and embodying the channel-tuning system of the invention.
Figure 3:
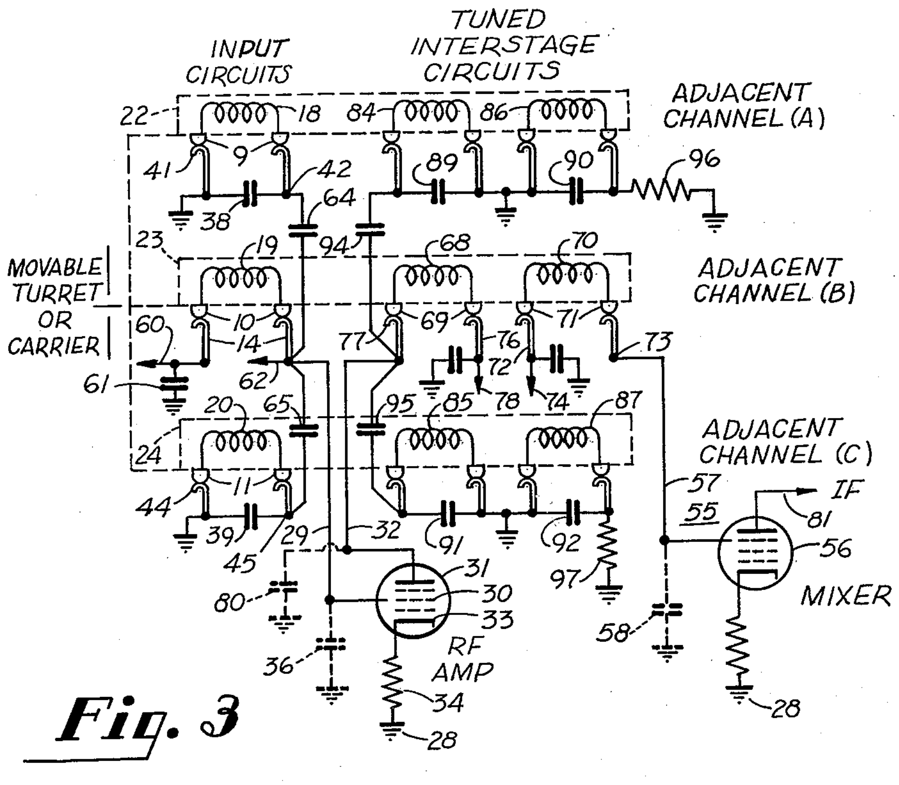
Figure 4:
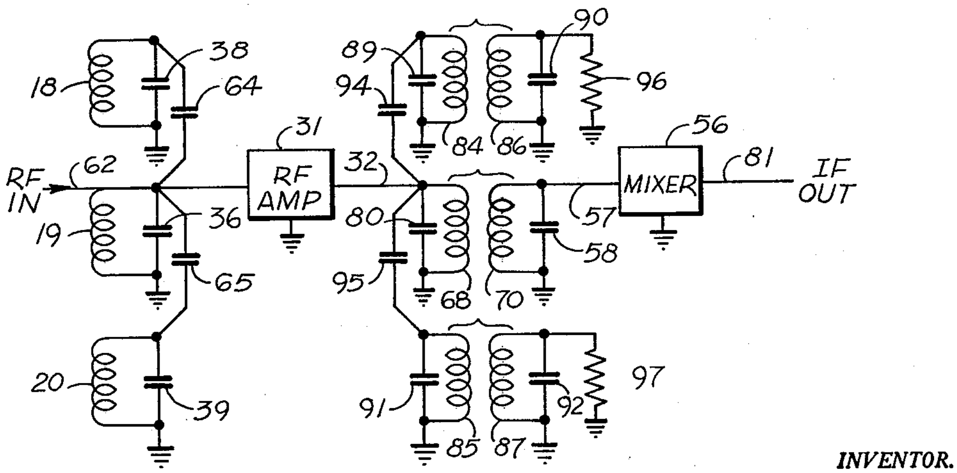

FIGURE 3 is a further schematic circuit diagram showing a modification of the channel-tuning system of FIGURE 2, as a further embodiment of the invention, and which is also adapted for use in turret-type channel-selector means as shown in FIGURE 1, and FIGURE 4 is a simplified schematic circuit diagram of the circuit of FIGURE 3, arranged to better illustrate the mode of operation thereof in accordance with the invention.

Referring to the drawings, in which like parts and circuit elements are designated by like reference numerals, and referring particularly to FIGURES 1 and 2, signal-receiver channel-selector means 5 is provided for the signal selecting and translating, or input circuits, 6 of a signal receiver, such as a television receiver for example. The signal selector means is shown, by way of example, as a turret-type tuner comprising a turret, or like element, 7 which rotates on a shaft 8 to carry sets of peripheral radially-extending contact elements or studs 9, 10, 11 and 12, and like remaining sets of contact studs as shown for the successive channels, progressively in a common path of movement into engagement with a set of fixed contacts 14 mounted on an insulating base 15 carried by a frame 16 for the channel selector or turret unit. The end bearings for the shaft 8 are conventional and are not shown in order to better show the contact relation and the tuner circuit elements.

Each of the sets of contact elements or studs on the turret tuner is connected with a tuning inductor for a different one of the several signal channels or signal frequencies through which the receiver is to be made responsive. In the present example only four of these channel tuning elements are shown, in order to simplify the drawing, as the remaining elements are similar except for frequency response. By way of example, the pretuned signal selecting circuits for four of the signal channels, designated as (A), (B), (C) and (D), are shown and include turret-mounted tuning inductors 18, 19, 20 and 21, respectively. These are mounted, respectively, on insulating turret strips 22, 23, 24 and 25 and connected, respectively, with sets of contact studs 9, 10, 11 and 12. This arrangement is schematically illustrated by the dotted outline of the turret elements in FIGURE 2. The movable element of the signal selector may be a turret or any suitable carrier elements adapted for movement in either of two directions as indicated by the arrowed lines.

The circuit connections provided by the elements of both FIGURES 1 and 2, make signal channel (B) the selected channel, and the inductor 19, as the main tuning element thereof, is connected actively in circuit with the signal translating channel 6 of the receiver through the fixed contacts 14. One of these is connected to common ground or chassis 28 for the receiver and the tuning system, and the other is connected through an input circuit lead 29 with the signal grid 30 of an amplifier tube 31 providing an RF amplifier stage. An anode output circuit 32 is provided for connection with the remainder of the receiver circuits and generally with a suitable mixer, as indicated and as shown in a subsequent figure to be described. The RF amplifier 31 is provided with common ground or chassis connection for the cathode 33 through a cathode circuit including a cathode resistor 34. Automatic gain control connections for the RF amplifier stage, as normally provided for the tube 31, are not shown in order to simplify the drawing, since the automatic gain control means does not concern the invention.

The input circuit for the RF amplifier stage thus includes the tuning inductor 19, connected between the grid circuit lead 29 and ground 28, and the distributed capacity of the input circuit for the stage, as represented by a capacitor 36 connected between the lead 29 and ground 28. Additional shunt tuning capacity means may be provided for the tuning inductor 19, but generally the latter is of a size to be tuned to the channel frequency by the distributed capacity of the circuit in a manner shown.

The input RF signal may be applied to the input circuit of the RF stage by any suitable means. In the present example, it is applied to the input circuit 29—28 in the signal translating channel serially through the adjacent-channel inductors 18 and 20 which are parallel tuned to the respective adjacent channel frequencies by fixed tuning capacitors 38 and 39 respectively and connected to form series wave traps.

For the purpose of connecting the wave traps, two additional sets or groups of fixed contacts 41—42, 44—45, are provided along with the first or main set of fixed contacts 14. The additional sets are for engaging the adjacent channel turret or carrier contact elements 9 and 11 for the inductors 18 and 20. The second set of fixed contacts 41—42 are mounted on an insulating base 43 and positioned on the frame 16 for engaging the contact elements 9 for the channel (A) inductor 18. The third set of fixed contacts 44—45 are similarly positioned on an insulating base 46 for engaging the contact elements 11 for the channel (C) inductor 20. The tuning capacitors 38 and 39 are connected between the fixed contacts 41—42 and 44—45, respectively, whereby two parallel tuned circuits are provided between the contact elements referred to.

With the contact elements for the channel selector means positioned as shown, the selected-channel tuning inductor 19 is connected as part of the input circuit 29—28 for the RF amplifier stage and is tuned by the circuit distributed capacity 36. An applied RF signal from any suitable source, represented by the terminals 48 and 49, is conveyed to the input circuit through a series circuit connection represented by a circuit lead 50 connected between the signal source or terminal 48 and the fixed contact element 42. The series circuit continues through the parallel tuned circuit 18—38 through a circuit lead 51 connected between the terminal 41 and the terminal 45 of the added contact groups or sets, and is then completed through the parallel tuned circuit 20—39 by a connection lead 52 between the terminal 44 and the input circuit lead 29.

Coupling between the formed trap circuits, which thus includes the adjacent channel circuit inductors 18 and 20, may thus be made conductively as with the series circuit connections shown in the present example. The selected-channel inductor 19 and the signal translating channel of the receiver are supplied with the applied signal from th source 48—49, serially through the tuned trap circuits 18—38 and 20—39, by the system shown.

Thus in a tuning system for television or radio signal receivers, or the like, which employ separate tuned circuits or circuit elements for signal or channel selection, it is possible to provide simple means for reducing or eliminating adjacent-channel interference. In the present example this is achieved by the addition of two sets of fixed contacts to the channel selector means 5 such that connection is made with the contact elements 9 and 11 thereof and the tuning elements 18 and 20 on both sides of the selected channel (B). The incoming signal is then applied to the input circuit or translating channel 6 of the receiver, which includes the selected tuning inductor 19, by the addition of coupling means which includes capacitive tuning means for the inductive tuning elements in a conductive series circuit between the signal source and the signal translating channel of the receiver. It will be seen that as the channel selector means, such as the turret shown, is actuated the successive pretuned signal-selecting circuits are arranged for connection individually with the signal translating channel of the receiver in predetermined sequence. Automatically, improved adjacent-channel selectivity is provided by the adjacent channel tuning elements which are connected into trap circuits by shunt tuning means connected therewith as they pass through adjacent-channel positions of the channel-selector means.

As hereinbefore referred to, coupling between the formed trap circuits and the signal translating channel, which includes the selected channel tuning circuits and elements, may also be provided by controlled mutual inductive coupling or controlled capacitive coupling for the proper operation of the trap circuits to absorb energy at the adjacent channel frequencies or bands of frequencies above and below the selected signal frequency. Coupling for the trap circuits by controlled capacity-coupling means may readily be provided in a progressive switching type channel-selecting means, such as the turret or carrier type shown in FIGURES 1 and 2 and the modification thereof as shown in FIGURES 3 and 4 to which attention is now directed.

In FIGURES 3 and 4 the channel tuning inductors 18, 19 and 20 and the shunt tuning capacitor means 38, 36 and 39 therefor, respectively, are shown by way of illustration. The turret or carrier is movable in the direction of the arrows as shown in FIGURE 3, and the turret strips 22, 23 and 24 are arranged to carry corresponding inductor elements for tuned interstage circuits which are provided for connection with a signal mixer stage 55. This includes an electronic signal mixer tube 56 having an input circuit provided between chassis ground 28 and a grid input circuit lead 57. The distributed capacity of the input circuit is indicated by a capacitor 58 connected between the lead 57 and ground.

In the turret or carrier positions shown in FIGURES 3 and 4, the tuning inductor 19 is connected through the fixed contacts 14 with the input circuit lead 29 for the RF stage amplifier tube 31 and the signal translating channel of the receiver, and the shunt distributed tuning capacitance 36 thereof, as in the preceding example. In the present circuit, one of the contacts 14 is connected to an automatic-gain-control lead 60 which is by-passed to ground by a capacitor 61 to complete the tuned input circuit. Signals are applied to the input circuit from any suitable source as in the preceding example. A suitable input circuit lead 62 as indicated in FIGURES 3 and 4 may be provided for this purpose.

Further in the present example, the adjacent-channel trap circuits are substantially loosely coupled to the input circuit 29 by capacitive coupling means comprising a small RF coupling capacitor 64 for the channel (A) trap circuit 18—38 and a similar small RF coupling capacitor 65 for the channel (C) trap circuit 20—39. The capacitor 64 is connected between the right hand contact element 14, as viewed in the drawing, and the contact element 42, while the contact 41 is connected to ground as shown. Likewise, the capacitor 65 is connected between the right hand contact 14, as viewed in the drawing, and the fixed contact element 45, while the contact element 44 is connected to chassis ground as shown. This provides an RF input circuit for the RF amplifier 31 having a circuit configuration which is more clearly seen by reference to the left hand portion of the circuit of FIGURE 4 along with FIGURE 3.

It will be seen that this provides one main channel which again is the selected channel (B), and two adjacent channel circuits comprising the tuning inductors 18 and 20 and capacitors 38 and 39 therefor as above and the coupling capacitors 64 and 65. The coefficient of coupling for the trap circuits, either capacitive or mutually inductive, is such that the circuits are not overcoupled to the main channel and can act fully as traps to absorb signal energy at the adjacent channel frequencies.

In the present example, it will be seen that this advantageous circuit arrangement is provided by the addition of two sets or groups of fixed contacts as in the preceding embodiment, one each of which is connected to chassis ground and the other of which in each set or group is capacitively coupled with the main channel circuit contact, or main channel tuning circuit, by a low-cost relatively small RF coupling capacitor. The degree of coupling provided by the capacitors is such that the effectively shunt-coupled trap circuits are operative to absorb energy from the signal translating channel at the adjacent channel frequencies, thereby enhancing the selectivity and adjacent-channel rejection characteristics of the tuning system. In television receivers particularly, this system provides effectively for reducing or eliminating adjacent-channel interference which has posed a serious problem due to the increasing number of television stations.

The output circuit or circuit lead 32 from the RF amplifier 31 is, in the present example, coupled to the input circuit or circuit lead 57 of the mixer stage 56 through tuned interstage circuits which include tuning inductors mounted on the same channel strips as the RF input circuit inductors above described. These may also be arranged for utilization as wave trap elements as well as channel tuning means, thereby to further enhance the adjacent channel rejection characteristic of the tuning system.

Referring now to the main channel interstage circuits, in operation on the same turret strip 23 as the main RF inductor 19 is an inductor 68 having contact studs or elements 69 and a second inductor 70, having contact studs or elements 71. These are arranged on the turret strip in mutual inductive-coupling relation, as indicated, as the primary and secondary windings respectively of interstage coupling transformer means. A set of fixed contacts 72 and 73 are arranged to engage the contact elements 71 of the turret, the contact 72 being connected with a bypassed bias supply circuit 74, and the contact 73 being connected with the input circuit lead 57 for the mixer stage. The distributed capacity 58 of the input circuit for the mixer stage is therefore in parallel with the inductor 70 and serves to tune it to resonance at the selected channel (B) frequency.

The contact elements 69 for the inductor 68 are provided with a set of fixed contact elements 76 and 77 connected respectively with a B+ supply lead 78 and the anode output circuit 32 of the RF amplifier 31. This inductor is tuned by the distributed capacity of the output circuit as represented by the capacitor 80. With this circuit arrangement, RF signals from the amplifier 31 are transferred to the mixer stage 56 through the interstage coupling circuits provided in connection with the tuned inductors 68 and 70, and from the mixer stage through an output circuit 81 to the remainder of the receiver circuits. The remainder of the receiver circuits do not concern the invention, and therefore are not shown.

The interstage tuning inductors 84 and 85 for adjacent channels (A) and (C), respectively, correspond in circuit position, to the inductor 68, and interstage tuning inductors 86 and 87 correspond, in circuit position, to the inductor 70. In the adjacent-channel positions, the inductors 84 and 86 are tuned respectively by fixed shunt capacitors 89 and 90, and the inductors 85 and 87 are likewise tuned by fixed shunt capacitors 91 and 92 respectively, as adjacent-channel wave-trap elements with connections through the movable contact studs or elements on the turret and sets of associated fixed contact elements, in a manner similar to the connections for inductors 18, 19 and 20. These interstage tuned trap circuits are coupled to the main channel at the output circuit 32 and the terminal 77 connected therewith, through respective relatively-small low-cost RF coupling capacitors 94 and 95 for adjacent channels (A) and (C). The trap circuits are provided with ground return connections, as indicated, in the adjacent channel positions.

Effectively the circuit arrangement of the tuning system is as shown in FIGURE 4, wherein it will be seen that controlled capacitive coupling through the capacitors 94 and 95 is provided for the double-tuned trap circuits on either side of the main channel. As indicated by the resistors 96 and 97 in connection with the windings 86 and 87, the loading on the double-tuned circuit may be controlled to provide the desired rejection characteristics. As in the preceding embodiment, three strips of a turret tuner are shown, only by way of example, with channel (B) as the selected channel and with channels (A) and (C) as the adjacent lower and upper channel traps utilizing controlled capacity coupling for the trap circuits.

From the foregoing description it will be seen that elimination or substantial reduction of adjacent channel interference, in a channel tuning system for signal receivers of the type having separate tuned circuits for signal or channel selection, may be achieved by the addition of only a few minor components and substantial minor circuit changes which enable existing signal selecting circuits, tuned to adjacent channels with respect to the selected channel, to be used effectively as trap circuits and thus improve the operation of the system, particularly for use in the congested metropolitan areas for television program reception.

What is claimed is:

1. A channel tuning system for signal receivers comprising, a plurality of tuning circuit elements, means for selectively connecting each of said circuit elements for effecting individual channel selection in a predetermined frequency range, means for connecting at least one of said circuit elements other than a selected circuit element for adjacent channel rejection with respect to a selected channel.

2. A tuning system comprising, means providing a source of signals having a frequency in any one of a plurality of frequency channels, a plurality of tuning elements each for tuning said system to a different one of said frequency channels, means for coupling a first of said tuning elements to said source to select signals having a frequency in one of said frequency channels, and means for coupling a second of said tuning elements to said source to attenuate signals in the frequency channel to which said second tuning element is adapted to tune said system.

3. A tuning system comprising, means providing a source of signals having frequencies in any one of a plurality of adjacent tuning channels, a plurality of tuning elements each for tuning said system to a different one of said frequency channels, means for coupling a first of said tuning elements to said source to select signals having a frequency in one of said frequency channels, and means for coupling a second of said tuning elements adapted to tune said system to a frequency channel adjacent the selected channel to said source to attenuate signals in said adjacent frequency channel.

4. A channel tuning system for signal receivers comprising, a plurality of circuit elements for channel selection, means for successively connecting each of said circuit elements for effecting individual signal or channel selection at different frequencies progressively over a predetermined frequency range, means for additionally connecting at least two of said circuit elements for adjacent-signal or channel response with respect to a selected signal or channel, and means for coupling said last named circuit elements with each selected circuit element to effect a reduction in adjacent signal or channel interference.

5. A turret tuner for television receivers having a rotatable drum with a plurality of tuning strips mounted about the periphery thereof, successive ones of said tuning strips including reactive circuit elements for tuning television receivers to successive television channels, a first set of fixed contacts for connecting the reactive circuit elements of a first of said tuning strips in said receiver to select a predetermined television channel, a second set of fixed contacts for connecting the reactive elements on a tuning strip adjacent said first tuning strip in said receiver to attenuate signals of a television channel frequency adjacent said selected channel.

6. In a channel-tuned signal receiver, the combination with a plurality of circuit tuning elements and means for selectively connecting said tuning elements for individual channel tuning, of means for converting adjacent channel circuit tuning elements into trap circuits responsive to adjacent-channel frequencies above and below each selected channel frequency, and means for effectively coupling selected and adjacent channel circuit tuning elements for absorbing signal energy at said adjacent-channel frequencies, thereby to reduce adjacent-channel interference in said receiver.

7. In a signal receiver, a channel tuning system comprising in combination, means providing a signal receiving and translating channel, a plurality of tuned circuit elements selectively connectable therein for signal or channel selection, and means operable in response to signal or channel selection of each of said tuned circuit elements for tuning and coupling adjacent signal or channel tuning circuit elements with said signal receiving and translating channel effectively as wave-trap circuits for reducing adjacent-channel interference in said receiver.

8. In a television signal receiver, the combination with a plurality of separate tuned circuit elements for channel selection and turret means with fixed and moving contacts for individually selecting each of said tuned circuit elements for tuning operation therein, of means including additional fixed contacts for the turret means and circuits connected therewith for converting adjacent-channel circuit elements into wave traps responsive to adjacent-channel frequencies with respect to a selected channel frequency, and means for effectively coupling said wave traps with each selected tuned circuit element for absorbing signal energy at the adjacent channel frequencies, thereby to reduce adjacent-channel interference in said receiver.

9. In a television signal receiver, the combination with a signal translating channel and a turret-type tuner having a plurality of channel-tuning circuit elements selectively connectable therein for signal or channel selection, of means operable in response to channel selection of one of said tuned circuit elements and including two additional sets of turret contacts and circuits connected therewith for tuning and coupling adjacent-channel tuning circuit elements with said signal translating channel effectively as wave-trap circuits for reducing adjacent-channel interference in said receiver.

10. A tuning system for a multi-channel signal receiver with effective adjacent-channel signal rejection, comprising in combination, means providing a signal translating channel having a plurality of separate tuned circuits for individual channel selection, turret-type channel selector means for said circuits having individual contact elements therefor, means for converting the adjacent-channel tuned circuits into adjacent-channel trap circuits successively and automatically in response to operation of the selector means for each selected channel, said means including contact elements on said channel selector means and circuit elements for connection with said adjacent-channel tuned circuits and coupling with the signal-translating channel of the receiver.

11. A channel tuning system for television signal receivers and the like adapted to provide effective adjacent-channel signal rejection and comprising in combination, means providing a signal translating channel and a plurality of separate tuned circuits connectable therein for individual channel selection, means for converting adjacent-channel tuned circuits into adjacent-channel trap circuits in response to adjustment of the system for each selected signal channel, and means providing controlled coupling between said trap circuits and each related tuned circuit in the signal translating channel of the receiver, whereby said trap circuits operate to absorb energy at adjacent-channel signal frequencies.

12. A channel tuning system for signal receivers comprising in combination, means providing a plurality of signal-selecting tuning inductors, movable carrier means for said inductors having contact elements for each of said inductors positioned for movement successively into predetermined spaced positions in a common path of movement, means providing a signal receiving and translating channel for said receiver having fixed contacts positioned for engaging said contact elements in one of said positions, means providing additional fixed contacts for engaging and connecting with others of said contact elements in adjacent channel positions on opposite sides of said one position, and means connected in circuit with said additional contacts for converting adjacent-channel tuning inductors into adjacent-channel trap circuits coupled with said signal receiving and translating channel of the receiver to a degree for effecting adjacent-channel signal rejection.

13. A tuning system for multi-channel signal receivers comprising in combination, means providing a signal-translating channel, a plurality of pretuned signal-selecting circuit elements adapted for connection with said signal translating channel and responsive progressively to different signal frequencies over a predetermined tuning range, means for connecting each of said circuit elements individually into said signal channel for tuning said receiver selectively to each of said signal frequencies, means for additionally connecting with the signal-selecting circuit elements for signal frequencies in the tuning range above and below a selected signal frequency, and circuit means for coupling said last-named signal-selecting circuit elements serially with said signal translating channel and introducing serially into said channel effective signal rejection at said frequencies above and below the selected signal frequency.

14. A channel tuning system for multi-channel signal receivers comprising in combination, means providing a signal translating channel, a plurality of pretuned signal-selecting circuit elements adapted for connection with said signal translating channel and responsive progressively to different signal frequencies over a predetermined tuning range, means for connecting each of said circuit elements individually into said signal channel for tuning said receiver selectively to each of said signal frequencies, said means including a first set of fixed contacts connected with said signal channel and sets of contact elements for said circuit elements movable successively into engagement individually with said fixed contacts in a common path of movement, a second and third set of fixed contacts positioned in said path of movement preceding and following said first set for simultaneously engaging and connecting with the signal-selecting circuit elements for signal frequencies above and below a selected signal frequency, and means connected with said second and third set of fixed contacts for coupling said last named signal-selecting circuit elements with said signal translating channel and introducing into said channel effective signal rejection at said frequencies above and below the selected signal frequency.

References Cited in the file of this patent

UNITED STATES PATENTS

| | | |
|---|---|---|
| 1,772,509 | Blye | Aug. 12, 1930 |
| 2,108,088 | Tufts | Feb. 15, 1938 |
| 2,773,988 | Thius | Dec. 11, 1956 |